US 6,636,576 B1

(12) United States Patent
Filoramo et al.

(10) Patent No.: US 6,636,576 B1
(45) Date of Patent: Oct. 21, 2003

(54) METHOD FOR REDUCING THE SETTLING TIME IN PLL CIRCUITS

(75) Inventors: Pietro Filoramo, Siracusa (IT); Gaetano Cosentino, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/413,713

(22) Filed: Oct. 5, 1999

(30) Foreign Application Priority Data

Oct. 6, 1998 (EP) .............................. 98830586

(51) Int. Cl.⁷ ............................................... H03L 7/093
(52) U.S. Cl. ....................................................... 375/376
(58) Field of Search ................................. 375/376, 375, 375/374; 331/12, 14, 17, 18, 25, 1 R; 332/127, 128; 327/156, 157, 159

(56) References Cited

U.S. PATENT DOCUMENTS

| 5,276,408 A | * | 1/1994 | Norimatsu ..................... 331/8 |
| 5,325,241 A | * | 6/1994 | Mattison et al. ............... 360/45 |
| 5,477,194 A | | 12/1995 | Nagakura ..................... 331/10 |
| 5,625,325 A | * | 4/1997 | Rotzoll et al. ................. 331/16 |

FOREIGN PATENT DOCUMENTS

| DE | 4031939 A1 | 5/1992 |
| EP | 0 360 442 A1 | 3/1990 |
| EP | 0 412 491 A2 | 2/1991 |

* cited by examiner

*Primary Examiner*—Don N. Vo
*Assistant Examiner*—Dung X. Nguyen
(74) *Attorney, Agent, or Firm*—Lisa K. Jorgenson; E. Russell Tarleton; Seed IP Law Group PLLC

(57) ABSTRACT

A method for reducing the settling time in PLL circuits, particularly for use in an RF transceiver, the PLL circuits including a phase comparator, a filter, a digital-analog converter and an adder that are suitable to produce in output a voltage ($V_C$) for controlling a voltage-controlled oscillator provided by means of a varactor, the method including determining the dependency of the control voltage ($V_C$) of the voltage-controlled oscillator on the frequency of a selected channel of a transmitter; and generating a law describing the variation of the output current ($I_{DAC}$) of the digital-analog converter such that the voltage ($V_{DAC}$) obtained from the output current of the digital-analog converter, added to an output voltage ($V_f$) of said filter keeps the filter voltage ($V_f$) constant in order to reduce the settling time of the PLL circuit as a selected channel varies.

22 Claims, 3 Drawing Sheets

METHOD FOR REDUCING THE SETTLING TIME IN PLL CIRCUITS

TECHNICAL FIELD

The present invention relates to a method for reducing the settling time in PLL circuits.

More particularly, the invention relates to a method for reducing the settling time in PLL circuits used for example in digital cordless telephones (for example of the DECT type).

BACKGROUND OF THE INVENTION

It is known that in recent years the world of wireless communications has changed very rapidly due, in part, to advances in silicon-based technologies, which have given great impulse to the use of electronic solutions of the monolithic type.

In particular, this technological impulse and market demand have led to the use of architectures of the RF transceiver which include the integration of the local oscillator, of the RF and IF transmitter and receiver section, and of part of the baseband circuits.

One of the blocks of an integrated transmitter is the PLL circuit.

In applications requiring a particularly short settling time, a frequency synthesizer is provided according to the block diagram shown in FIG. 1, in which the reference numeral 1 designates a clock signal which is input to a phase comparator 2, which is followed in a cascade configuration by a charge pump circuit 3 and by a filtering circuit 4. The voltage signal in output from the filtering circuit 4 is input to an adder 5, which receives, on its inverting input a signal that arrives from a DAC to which a digital word WORD is input.

The output of the adder 5 is sent to a voltage-controlled oscillator 6, which feeds back its output, by means of a divider 7, to the phase comparator 2.

The above-described block diagram differs from a conventional layout in that there is a digital-analog converter and an adder. The function of these elements is to perform the analog algebraic sum of the voltage $V_F$ that arrives from the filter 4 and of a reference voltage $V_{DAC}$ produced by the current $I_{DAC}$ on the feedback resistor $R_F$ of the adder circuit 5.

In formal terms, this is stated as follows:

$$V_C = V_F - R_F I_{DAC}(W)$$

where w is the digital word WORD input to the DAC 8.

The purpose of this structure is to provide, during channel transitions, by means of a suitable control of the DAC 8, a voltage $R_F I_{DAC}$ which follows the variations of the control voltage, so as to leave the voltage across the filter 4 ideally constant.

In this manner, the settling time of the PLL circuit shown in FIG. 1 is limited only by the settling time of the voltage-controlled oscillator 6 and of the DAC 8 and is therefore very short.

In the real case, the voltage supplied by the DAC 8 is affected by a quantization error and accordingly, assuming that the channel transitions are instantaneous with respect to the reaction times of the PLL, this quantization error leads directly to an initial offset of the synthesized frequency (with respect to the steady-state value), according to a relation in which the frequency deviation is equal to the quantization error multiplied by the gain factor of the voltage-controlled oscillator 6.

If the locking conditions of the PLL are still met, this deviation is recovered by the synthesizer loop with a settling time which is directly proportional to said frequency deviation.

However, the efficiency of the system increases as the frequency deviation at the beginning of the transient decreases.

However, the need to cover the required synthesizing band regardless of process tolerances forces high values of the gain factor of the voltage-controlled oscillator 6.

This entails that in order to obtain a low settling time it is necessary to minimize the quantization error. This is achieved in conventional applications by using a DAC with a large number of bits.

This solution, however, entails several evident drawbacks. First of all, a large number of bits increases the complexity of the control logic of the system in which the PLL circuit is placed. Moreover, this solution also entails a higher consumption of current for an equal noise contribution and in most cases entails the use of complicated circuit topologies, with a consequent increase in silicon area occupation.

SUMMARY OF THE INVENTION

The present invention provides a method for reducing the settling time in PLL circuits in which it is possible to minimize frequency deviation in said circuits.

According to one aspect of the present invention, a method for reducing the settling time in PLL circuits that allows use of a DAC control logic that is proportionally simpler than known solutions is provided.

Another aspect of the present invention is to provide a method for reducing the settling time in PLL circuits to achieve reduced current consumption.

A further aspect of the present invention is to provide a method for reducing the settling time in PLL circuits to obtain less complicated DAC circuit topologies than known solutions and therefore with smaller silicon area occupations.

Yet another aspect of the present invention is to provide a method for reducing the settling time in PLL circuits that is highly reliable, relatively easy to provide, and at competitive costs.

These and other features and advantages, which will become apparent hereinafter, are achieved by a method for reducing the settling time in PLL circuits, particularly for use in an RF transceiver, that includes a phase comparator, a filter, a digital-analog converter, and an adder suitable to produce in output a voltage for controlling a voltage-controlled oscillator provided by means of a varactor. The method provides:

determining the dependency of the control voltage of the voltage-controlled oscillator on the frequency of a selected channel of a transmitter;

generating a law describing the variation of the output current of the digital-analog converter such that the voltage obtained from the output current of the digital-analog converter, added to an output voltage of the filter, is such as to keep the filter voltage constant, in order to reduce the settling time of the PLL circuit when changing a selected channel.

BRIEF DESCRIPTION OF THE DRAWINGS

Further characteristics and advantages of the invention will become apparent from the description of a preferred but not exclusive embodiment of the method according to the invention, illustrated only by way of non-limitative example in the accompanying drawings, wherein.

DETAILED DESCRIPTION OF THE INVENTION

With reference to the above figures, the method according to the present invention is as follows.

As mentioned, a voltage $V_C$ for controlling the voltage-controlled oscillator 6 is correlated to the voltage $V_F$ at the output of the filter 4 and to the voltage $R_F I_{DAC}$ produced by the DAC 8. This relation shows that if the law of variation of the DAC 8 is such as to keep the quantity $V_C + RI_{DAC}$ constant, then the voltage of the filter 4 remains constant and the settling time of the loop becomes ideally zero.

The method according to the invention entails, once the law of variation $V_C(f)$ of the voltage for controlling the voltage-controlled oscillator 6 as a function of the channel frequency is known, the generation of a current $I_{DAC}$ satisfies the previously described relation that links the control voltage of the voltage-controlled oscillator to the output voltage of the filter 4 and to the current produced by the DAC 8 for each one of the selected channels.

It is assumed that there is a one-to-one relation between the word WORD of the DAC 8 and the frequency of the selected channel.

Figure 1:
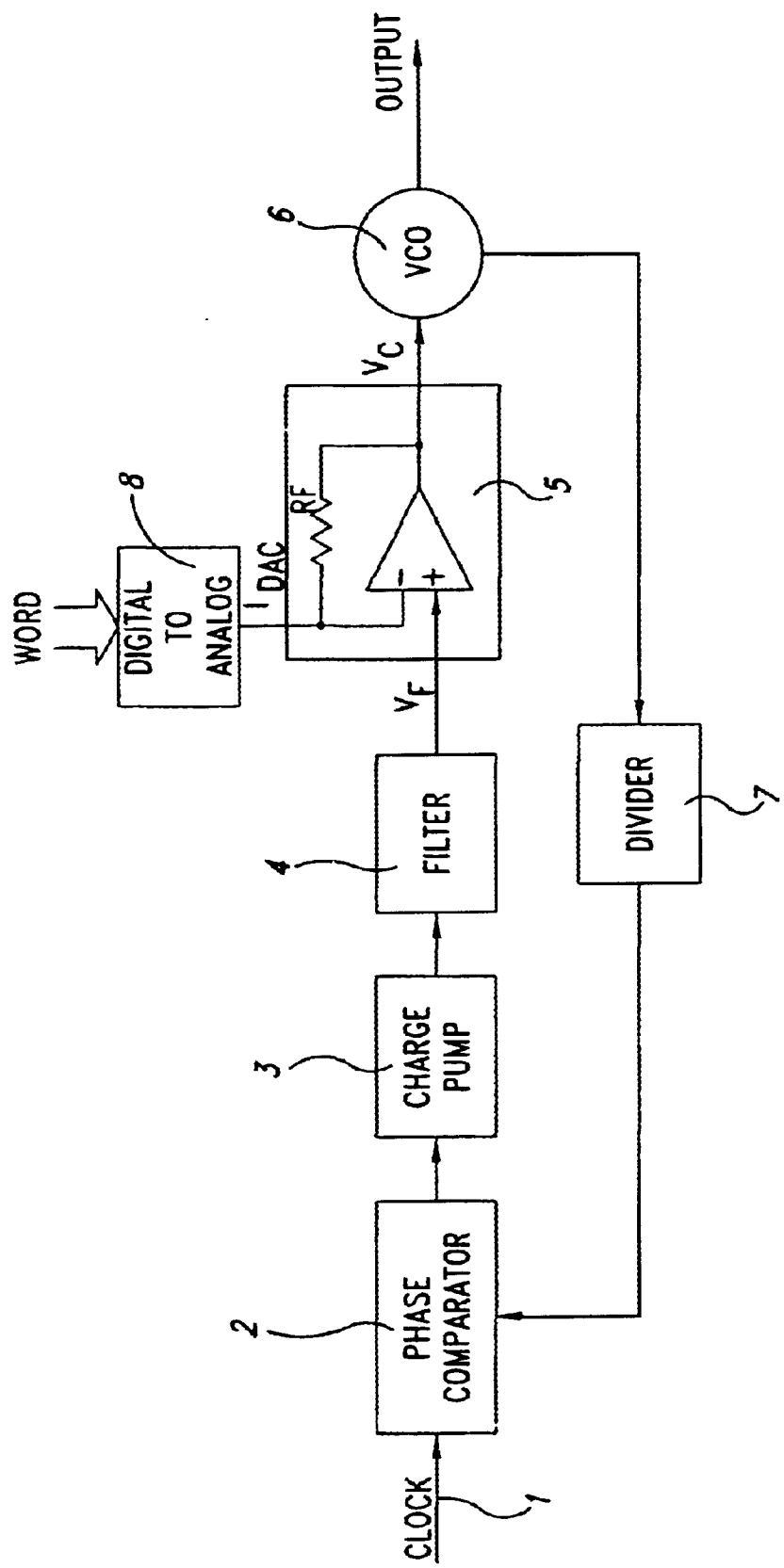
FIG. 1 is a block diagram of a PLL circuit to which the method according to the present invention has been applied.
Figure 2:
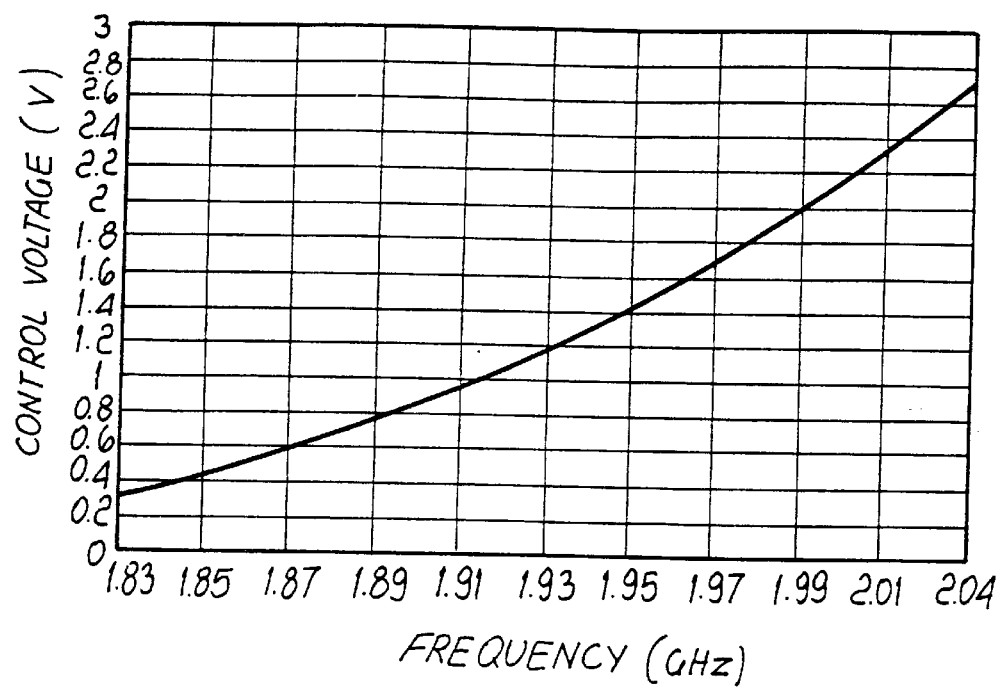
FIG. 2 is a chart which plots, by way of example, the control voltage of a voltage-controlled oscillator with respect to the frequency for a voltage-controlled oscillator of the varactor type.

If the voltage-controlled oscillator 6 is implemented by means of a varactor, the curve $V_C(f)$ that describes the dependency of the control voltage of the voltage-controlled oscillator 6 on the selected channel frequency is of the type shown in FIG. 2.

Since this curve has a quadratic development, in order to minimize the variation of the voltage across the filter 4 the characteristic curve of the DAC 8 must also follow the same law.

Figure 3:
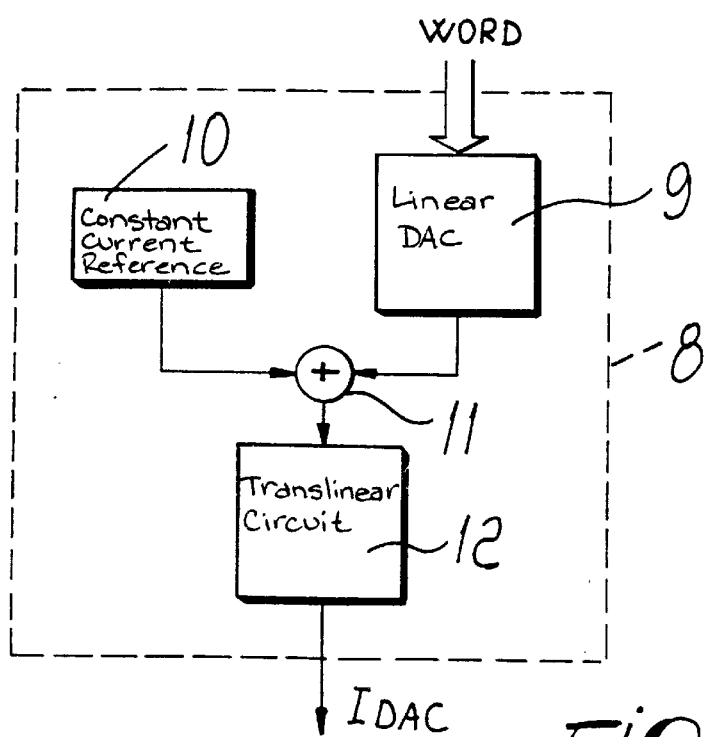
FIG. 3 is a block diagram of a DAC topology applied in the method according to the present invention.

The quadratic law of the DAC 8 has been obtained by using circuits according to the block diagram shown in FIG. 3.

In this diagram, it can be seen that the polynomial rule of the DAC 8 is generated by raising to the power of two a linear combination of a constant current reference 10 and of a current signal that arrives from a linear DAC 9. In order to make the system efficient, the design of the individual blocks and of the weights of the linear combination obtained by performing the sum of the node 11 has been carefully performed so as to make the control voltage $V_C$ related to a given channel correspond to each word WORD of the DAC 9.

The operation for raising to the power of two has been obtained with analog methods by using a conventional translinear circuit 12. The individual circuit components 9, 10, 11 and 12 are known per se in the art, but are provided in a new combination herein. Any suitable equivalent component may be interchanged with the individual ones shown to achieve the overall purpose and function of the invention.

In this manner, the quantization law induced by the linear DAC is particularly efficient, since it tends to produce the same initial frequency deviation for each selected channel.

This characteristic is particularly advantageous for determining the dimensions of the DAC 9 and of the associated control circuits, since the number of bits of the DAC no longer needs to include redundant configurations in order to deal with the different weight of the quantization effect of the selected channel, as occurs instead in conventional PLL implementations.

Figure 4:
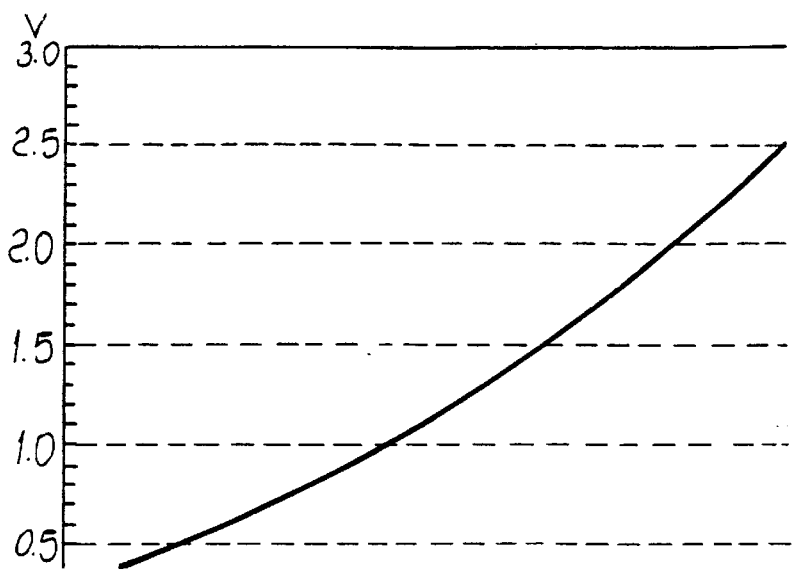
FIG. 4 is an exemplifying chart which plots the output characteristic of a seven-bit DAC used to optimize the settling times of a PLL having a VCO provided by means of a varactor, the method according to the invention.

FIG. 4 plots, by way of example, the output characteristic of a 7-bit DAC used to optimize the settling times of a PLL with a VCO provided by means of a varactor.

Figure 5:
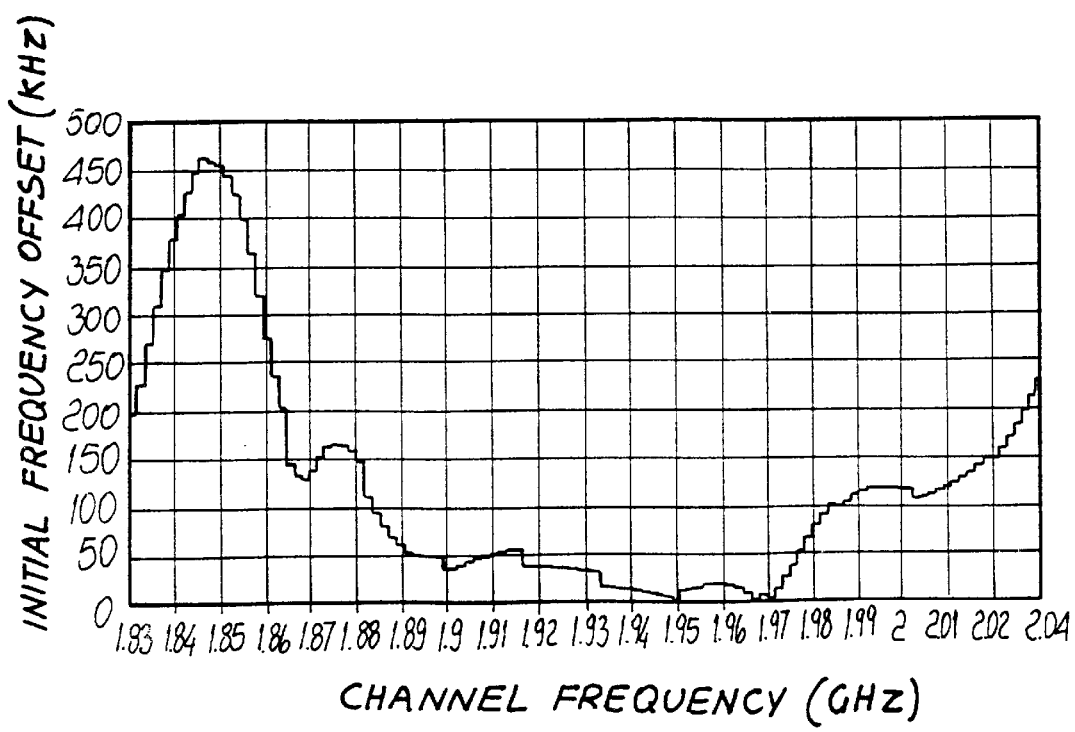
FIG. 5 is an exemplifying diagram of the frequency offset of the PLL circuit produced by a channel variation.

FIG. 5 instead plots the frequency offset of the PLL due to a channel variation. This offset is clearly a function of the channel and is to be understood as an initial frequency deviation with respect to the new selected channel.

The frequency offset plotted in FIG. 5 must be compared to the frequency offset that would be produced if the DAC were inactive, the minimum value of which is clearly equal to the channel separation interval. For example, in the case of application to a cordless telephone of the DECT type, the channels are separated by an interval of 1.728 MHz and therefore the use of the DAC having the characteristic plotted in the figure induces a significant improvement in the PLL settling time.

It should in fact be noted that the use of a linear DAC 9 having the same number of bits would not have been efficient, since the initial frequency offset would have been greater than the channel separation interval over approximately half of the frequency interval being considered.

Therefore, it is evident that with an equal number of bits of the digital-analog converter DAC it is possible to improve the performance of a PLL with a varactor VCO in terms of settling and precision of the synthesized frequency.

In practice it has been observed that the method according to the invention allows to ensure a very short PLL settling time without modifying the loop filter.

The method thus conceived is susceptible of numerous modifications and variations, all of which are within the scope of the inventive concept.

Thus, for example, since the voltage-controlled oscillator must have the same law as the varactor, for example a quadratic law as described earlier, it is necessary to provide, as mentioned, a suitable translinear circuit which follows the law of the varactor.

Therefore, if the varactor has a cubic law, the translinear circuit must be able to provide a law such that the output current of the DAC has a cubic behavior.

What is claimed is:

1. A method for reducing the settling time in PLL circuits which have a phase comparator, a filter, a digital-analog converter and an adder that are suitable to produce in output a voltage for controlling a voltage-controlled oscillator provided by means of a varactor, comprising:

determining the dependency of the control voltage of said voltage-controlled oscillator on the frequency of a selected channel of a transmitter; and generating a law describing the variation of the output current of said digital-analog converter, wherein said law of variation of the output current of said digital-analog converter is nonlinear, such that the voltage obtained from the output current of said digital-analog converter, added to an output voltage of said filter, is such as to keep said filter voltage constant, in order to reduce the settling time of said PLL circuit when changing a selected channel.

2. The method of claim 1 wherein generating said law of variation of the output current of the digital-analog converter comprises raising to the power of two a linear combination of a constant current reference and of a current signal that originates from a linear digital-analog converter.

3. The method of claim 1 wherein each digital word in input to the digital-analog converter has a one-to-one correspondence with the control voltage of said voltage-controlled oscillator in relation to a channel of said transmitter.

4. A PLL circuit with reduced settling time, particularly for use in RF transceivers, comprising:
   a phase comparator, which is cascade-connected to a charge pump circuit and to a filter;
   a digital-analog converter;
   an adder; and
   a voltage-controlled oscillator provided by means of a varactor, wherein said digital-analog converter is nonlinear, the output current signal of said converter being input to said adder together with a voltage signal output by said filter, said output current signal of said digital-analog converter being variable according to a law such that the voltage obtained from the output current of said digital-analog converter, added to an output voltage of said filter, is such as to keep said filter voltage constant, in order to reduce the settling time of said PLL circuit when a selected channel changes and wherein said law of variation of the output current of said digital-analog converter is nonlinear.

5. The circuit of claim 4 wherein the output current signal of said digital-analog converter is obtained by raising to the power of two a linear combination of an output current signal of a linear digital-analog converter and of a constant current reference signal.

6. The circuit of claim 5 wherein said nonlinear digital-analog converter is nonlinear and is constituted by said linear digital-analog converter and by means suitable to provide said linear combination followed by said raising to the power of two.

7. The circuit of claim 4 wherein each digital word in input to the nonlinear digital-analog converter has a one-to-one correspondence with the control voltage of said voltage-controlled oscillator in relation to a channel selected in a transceiver.

8. The circuit of claim 5, wherein contiguous channels of said transceiver correspond to contiguous digital words of said nonlinear digital-analog converter.

9. A PLL circuit, comprising:
   a phase comparator circuit having an input terminal coupled to a clocked signal source, a feedback input terminal, and an output terminal;
   a charge pump circuit having an input terminal connected to the output terminal of the phase comparator, and an output terminal;
   a filter circuit having an input terminal coupled to the output terminal of the charge pump, and an output terminal;
   an adder circuit having a non-inverting input terminal connected to the output terminal of the filter circuit, an inverting input terminal, and an output terminal;
   a voltage-controlled oscillator having an input terminal coupled to the output terminal of the adder circuit, an output terminal, and a feedback output terminal coupled to the feedback input terminal of the phase comparator; and
   a digital-analog converter (DAC) having an output terminal coupled to the inverting input terminal of the adder circuit, and an input terminal configured to receive a word signal, the DAC configured to output a non-linear signal having characteristics that are a function of the characteristics of a selected transmitter frequency and that maintain a constant filter circuit output voltage.

10. The circuit of claim 9, wherein the DAC comprises a linear DAC having an input terminal for receiving a word signal corresponding to a selected transmitter frequency and an output terminal coupled to a summing node, a constant current generator having an output terminal coupled to the summing node, and a translinear circuit with an input terminal coupled to the summing node and an output terminal coupled to the DAC output terminal.

11. The circuit of claim 10 wherein the translinear circuit is configured to raise to the power of two a linear combination of the constant current generator circuit output and a current signal from the linear DAC.

12. The circuit of claim 9, further comprising a divider circuit coupled to the feedback output terminal of the voltage-controlled oscillator and to the feedback input terminal of the phase comparator.

13. The circuit of claim 9 wherein the voltage-controlled oscillator comprises a varactor.

14. A method for reducing settling time in a PLL circuit having a phase comparator cascade-connected to a charged pump circuit, a filter circuit, an adder circuit with DAC input, and a voltage-controlled oscillator having a feedback coupled to the phase comparator, the method comprising:
   determining the signal characteristics of a voltage for controlling the voltage-controlled oscillator as a function of a transmitter channel frequency received at the DAC input in order to maintain the filter output voltage constant;
   providing a non-linear DAC output signal having variations substantially matching the variations of the voltage control signal of the voltage-controlled oscillator; and
   generating the voltage control signal for the voltage-controlled oscillator, comprising summing the DAC output signal with the filter output signal to maintain a constant filter output signal voltage and reduce settling time in response to changing channel frequencies in a RF that triggered a format transceiver circuit.

15. The method of claim 14 wherein providing a DAC output signal comprises raising to the power two a linear combination of a constant current reference and of a current signal that originates from a linear digital-analog converter.

16. The method of claim 15, further comprising receiving a word input signal in the linear digital analog converter, the word signal having a one-to-one correspondence with the voltage control signal of the voltage-controlled oscillator in relation to channel frequencies in a RF transceiver circuit.

17. A method for reducing the settling time in PLL circuits which have a phase comparator, a filter, a digital-analog converter and an adder that are suitable to produce in output a voltage for controlling a voltage-controlled oscillator provided by means of a varactor, comprising:
   determining the dependency of the control voltage of said voltage-controlled oscillator on the frequency of a selected channel of a transmitter;

generating a law describing the variation of the output current of said digital-analog converter such that the voltage obtained from the output current of said digital-analog converter, added to an output voltage of said filter, is such as to keep said filter voltage constant, in order to reduce the settling time of said PLL circuit when changing a selected channel, wherein generating said law of variation of the output current of the digital-analog converter comprises raising to the power of two a linear combination of a constant current reference and of a current signal that originates from the linear digital-analog converter.

18. A method for reducing the settling time in PLL circuits which have a phase comparator, a filter, a digital-analog converter and an adder that are suitable to produce in output a voltage for controlling a voltage-controlled oscillator provided by means of a varactor, comprising:

inputting to the digital-analog converter a digital word having a one-two-one correspondence with the control voltage of the voltage-controlled oscillator in relation to a selected channel of a transmitter;

determining the dependency of the control voltage of said voltage-controlled oscillator on the frequency of the selected channel of the transmitter;

generating a law describing the variation of the output current of said digital-analog converter such that the voltage obtained from the output current of said digital-analog converter, added to an output voltage of said filter, is such as to keep said filter voltage constant, in order to reduce the settling time of said PLL circuit when changing a selected channel.

19. A PLL circuit with reduced settling time, particularly for use in RF transceivers, comprising:

a phase comparator, which is cascade-connected to a charge pump circuit and to a filter;

a digital-analog converter;

an adder; and a voltage-controlled oscillator provided by means of a varactor, wherein said digital-analog converter is nonlinear, the output current signal of said converter being input to said adder together with a voltage signal output by said filter, said output current signal of said digital-analog converter being variable according to a law such that the voltage obtained from the output current of said digital-analog converter, added to an output voltage of said filter, is such as to keep said filter voltage constant, in order to reduce the settling time of said PLL circuit when a selected channel changes, wherein the output current signal of the digital-analog converter is obtained by raising to the power of two a linear combination of an output current signal of a linear digital-analog converter and of a constant current reference signal.

20. A PLL circuit with reduced settling time, particularly for use in RF transceivers, comprising:

a phase comparator, which is cascade-connected to a charge pump circuit and to a filter;

a digital-analog converter;

an adder; and a voltage-controlled oscillator provided by means of a varactor, wherein said digital-analog converter is nonlinear, the output current signal of said converter being input to said adder together with a voltage signal output by said filter, said output current signal of said digital-analog converter being variable according to a law such that the voltage obtained from the output current of said digital-analog converter, added to an output voltage of said filter, is such as to keep said filter voltage constant, in order to reduce the settling time of said PLL circuit when a selected channel changes, wherein the digital-analog converter is configured to receive a digital word in input that has a one-two-one correspondence with the control voltage of the voltage-controlled oscillator in relation to a channel selected in a transceiver.

21. A PLL circuit, comprising:

a phase comparator circuit having an input terminal coupled to a clocked signal source, a feedback input terminal, and an output terminal;

a charge pump circuit having an input terminal connected to the output terminal of the phase comparator, and an output terminal;

a filter circuit having an input terminal coupled to the output terminal of the charge pump, and an output terminal;

an adder circuit having a non-inverting input terminal connected to the output terminal of the filter circuit, an inverting input terminal, and an output terminal;

a voltage-controlled oscillator having an input terminal coupled to the output terminal of the adder circuit, an output terminal, and a feedback output terminal coupled to the feedback input terminal of the phase comparator; and a digital-analog converter (DAC) having an output terminal coupled to the inverting input terminal of the adder circuit, and an input terminal configured to receive a word signal, the DAC configured to output a signal having characteristics that are a function of the characteristics of a selected transmitter frequency and that maintain a constant filter circuit output voltage, wherein the DAC comprises a linear DAC having an input terminal for receiving a word signal corresponding to a selected transmitter frequency and an output terminal coupled to a summing node, a constant current generator having an output terminal coupled to the summing node, and a translinear circuit with an input terminal coupled to the summing node and an output terminal coupled to the DAC output terminal.

22. A method for reducing settling time in a PLL circuit having a phase comparator cascade-connected to a charged pump circuit, a filter circuit, an adder circuit with DAC input, and a voltage-controlled oscillator having a feedback coupled to the phase comparator, the method comprising:

determining the signal characteristics of a voltage for controlling the voltage-controlled oscillator as a function of a transmitter channel frequency received at the DAC input in order to maintain the filter output voltage constant;

providing a DAC output signal having variations substantially matching the variations of the voltage control signal of the voltage-controlled oscillator, wherein providing a DAC output signal comprises raising to the power of two a linear combination of a constant current reference and of a current signal that originates from a linear digital-analog converter; and generating the voltage control signal for the voltage-controlled oscillator, comprising summing the DAC output signal with the filter output signal to maintain a constant filter output signal voltage and reduce settling time in response to changing channel frequencies in a RF that triggered a format transceiver circuit.

* * * * *